United States Patent [19]

Wallbillich

[11] Patent Number: 4,590,146
[45] Date of Patent: May 20, 1986

[54] STABILIZATION OF PHOTOPOLYMERIZABLE MIXTURES

[75] Inventor: Guenter Wallbillich, Schifferstadt, Fed. Rep. of Germany

[73] Assignee: BASF Aktiengesellschaft, Fed. Rep. of Germany

[21] Appl. No.: 628,320

[22] Filed: Jul. 6, 1984

[30] Foreign Application Priority Data

Jul. 8, 1983 [DE] Fed. Rep. of Germany ....... 3324642

[51] Int. Cl.$^4$ ............................................. G03C 1/68
[52] U.S. Cl. .................................... 430/281; 430/286; 430/917; 430/925; 525/61; 522/113
[58] Field of Search ............... 430/281, 917, 925, 286; 204/159.18; 525/61

[56] References Cited

U.S. PATENT DOCUMENTS

| 3,859,098 | 1/1975 | Iwama et al. | 430/925 |
| 3,895,954 | 7/1975 | Roteman | 430/925 |
| 3,953,210 | 4/1976 | Hasegawa et al. | 430/925 |
| 4,033,773 | 7/1977 | Lewis et al. | 430/925 |
| 4,049,517 | 9/1977 | Adachi et al. | 204/159.18 |
| 4,058,443 | 11/1977 | Murata et al. | 204/159.18 |
| 4,279,985 | 7/1981 | Nonogaki et al. | 430/281 |
| 4,297,435 | 10/1981 | Jolly et al. | 430/925 |
| 4,304,838 | 12/1981 | Hasegawa et al. | 204/159.18 |
| 4,341,860 | 7/1982 | Sysak | 430/925 |
| 4,448,658 | 5/1984 | Olson | 204/159.18 |

FOREIGN PATENT DOCUMENTS

| 786119 | 11/1957 | United Kingdom . |
| 834337 | 5/1960 | United Kingdom . |
| 835849 | 5/1960 | United Kingdom . |
| 1233883 | 6/1971 | United Kingdom . |
| 1251475 | 10/1971 | United Kingdom . |
| 1416440 | 12/1975 | United Kingdom . |

Primary Examiner—Jack P. Brammer
Attorney, Agent, or Firm—Keil & Weinkauf

[57] ABSTRACT

Photopolymerizable water-soluble or water-dispersible mixtures essentially consisting of a base polymer, at least one polymerizable ethylenically unsaturated compound and at least one photoinitiator and/or photosensitizer are stabilized to thermal polymerization by treating the base polymer with a halogen, a pseudohalogen or a polyhalide.

4 Claims, No Drawings

STABILIZATION OF PHOTOPOLYMERIZABLE MIXTURES

The present invention relates to a process for stabilizing photopolymerizable water-soluble or water-dispersible mixtures, essentially consisting of a base polymer, one or more polymerizable ethylenically unsaturated compounds and one or more photoinitiators and/or photosensitizers to thermal polymerization.

Photopolymerizable mixtures of the stated type become insoluble when exposed to light, and it is known that they can be used for the production of printing plates, coating materials and photosensitive finishes, and in general for the fixing, reproduction and transfer of information. However, these mixtures have to be stabilized against premature spontaneous thermal polymerization, which can occur during processing, storage or transport. A conventional method comprises the addition of free radical acceptors, antioxidants, peroxide-decomposing substances, hydrogen acceptors and donors, electron acceptors and donors and/or complex formers. Gases too, eg. oxygen and the oxides of nitrogen, can play an important role in suppressing the spontaneous polymerization of photopolymerizable mixtures. A large number of specific compounds have been described as being suitable, eg. phenolic compounds, hydroquinone and its derivatives, amines, nitrosamines, nitro and nitroso compounds, hydroxylamines, N-nitrosohydroxylamine derivatives, hydrazines, urea and its derivatives, thiourea and its derivatives, dithiocarbamates, pyridines, quinolines, N-containing heterocyclic compounds, sulfur, ascorbic acid, tocopherol, methylene blue, phosphines, phosphites and complex formers, such as polyphosphoric and polysilicic acids and their salts, nitrilotriacetic acid, EDT and hydroxycarboxylic acids. Furthermore, combinations of two or more compounds of the stated type have been disclosed, generally because of a synergistic effect. However, these thermal polymerization inhibitors frequently have the disadvantage that they reduce the photosensitivity even though they are completely effective in improving the stability of the photosensitive materials. In choosing the stabilizers, their color should also be taken into account, since the occurrence of discoloration during storage and in the reactions presents problems in connection with the use of the photopolymerizable mixtures. This is particularly important since most stabilizers and/or their secondary products often absorb in the wavelength range from 300 to 500 nm, which is important for the photopolymerization.

Particularly with regard to the use of photopolymerizable mixtures for the storage, reproduction and transfer of information, the stated disadvantages or limitations of the conventional stabilizers have to be taken into account very carefully. For example, high photosensitivity has recently become a very much greater requirement in the abovementioned field of use. However, the use of the conventional thermal polymerization inhibitors does not result in photopolymerizable mixtures which on the one hand possess high sensitivity and on the other hand do not give rise to difficulties when used in practice. The mixtures which have a complex composition and possess the desired high photosensitivity are just the ones where there is a large number of possible ways in which premature polymerization can be initiated. The high photosensitivity also necessitates the metering of a very small amount of the stabilizers, the choice of which furthermore is greatly restricted by the requirement for transparency in the wavelength range in which the polymerization is initiated.

On the other hand, the tendency, arising out of environmental reasons, to produce photopolymerizable mixtures free of organic solvents, or very greatly to reduce the amount of organic solvents, necessitates the development of substantially novel photopolymerizable systems, for which the conventional stabilizers are in general very inadequate. This applies in particular because the photopolymerizable mixtures suitable for information processing have to meet very high requirements in respect of sensitivity and resolution, ie. high reproduction density.

It is an object of the present invention to provide a process for stabilizing photopolymerizable mixtures to thermal polymerization, wherein the photopolymerizable mixtures obtained possess high photosensitivity and high resolution, ie. excellent optical properties, and do not have the the above disadvantages.

We have found, surprisingly, that this object is achieved, and that photopolymerizable water-soluble or water-dispersible mixtures essentially consisting of a base polymer, at least one ethylenically unsaturated compound and at least one compound selected from the group consisting of photoinitiators and photosensitizers can be stabilized to thermal polymerization if the starting polymer is treated with a compound selected from the group consisting of halogens, pseudohalogens and polyhalides.

In an advantageous embodiment of the process according to the invention, the base polymer, together with the other components of the photopolymerizable mixture, is treated with a compound selected from the group consisting of halogens, pseudohalogens and polyhalides.

The novel process can be carried out particularly advantageously by treating the base polymer, alone or together with the other components of the photopolymerizable mixture, with a halogen, a pseudohalogen or polyhalide in the presence of water or in aqueous solution at from 20° to 100° C.

Advantageously, the novel treatment of the base polymer with the halogen or halogen equivalent in the course of from half an hour to several days is combined with a dissolving, mixing or dispersing process which in any case has to be carried out during the preparation or processing of the photopolymerizable mixture.

Suitable halogens for carrying out the novel process are chlorine, bromine and iodine, the last-mentioned element being particularly preferred. Pseudohalogens, which can also be used, are those molecules which consist of two or more electronegative atoms and whose physical and chemical properties are similar to those of the halogens, examples of pseudohalide groups being —CN, —OCN, —SCN and —N$_3$. The novel process can also be carried out using polyhalides, and these may be either inorganic or organic polyhalides. The inorganic polyhalides possess complex anions which are obtained when free halogens form an adduct with a halide ion. The higher the atomic weight of the halogen and the larger the atomic volume of the cation, the more easily are these complex anions formed and the more stable they are. KI.I$_2$ is particularly suitable for the present invention. A large number of organic polyhalides have been prepared. Most nitrogen bases are capable of forming polyhalides, in particular polyiodides. Among the aromatic amines and the aromatic and aliphatic ammonium bases, the secondary, tertiary and quarternary compounds, in particular, give stable polyiodides. The adduct of iodine with polyvinylpyrrolidone is advantageous for the stabilization process according to the invention.

The amount of halogen donor employed in the novel process is, depending on the type of halogen donor which can be used, from 0.001 to 1.0% by weight, based on the amount of anhydrous photopolymerizable mixture.

In the case of the preferred substances, such as potassium iodide-iodine, the amount used is, in particular, from 0.002 to 0.5% by weight, while in the case of polyvinylpyrrolidone-iodine the amount is from 0.005 to 1.0% by weight. The residence time is then advantageously from 3 to 24 hours, and the temperature is from 40 to 90° C.

The composition of the photopolymerizable water-soluble or water-dispersible mixtures is known per se. Examples of suitable photosensitive layers of one or more hydrophilic polymeric binders with one or more compatible photopolymerizable ethylenically unsaturated monomers and one or more photoinitiators mixtures as described in, inter alia, British Pat. Nos. 786,119, 834,337, 835,849, 1,233,883, 1,251,475 and 1,416,440.

Vinyl alcohol polymers containing -$CH_2CH(OH)$ structural units in the polymer main chain, and their water-soluble or water-dispersible copolymers and derivatives, eg. esters, ethers or acetals, have proven particularly useful base polymers. Particularly suitable compounds are the conventional hydrolyzed polyvinyl esters of aliphatic monocarboxylic acids of 1 to 4 carbon atoms, eg. polyvinyl acetates or polyvinyl propionates, which have a mean degree of polymerization of from 200 to 3,000, in particular from 250 to 750, and a degree of hydrolysis of from 65 to about 100, in particular from 80 to 88, mole %. Mixtures of hydrolyzed vinyl ester polymers or copolymers having different degrees of polymerization and/or different degrees of hydrolysis can also be used. Other suitable compounds in this connection are the reaction products of vinyl alcohol polymers with acrylic and/or methacrylic anhydride, these products containing in general from 3 to 30% by weight, based on the reaction product, of acryloyl or methacryloyl groups as copolymerized units, as well as the water-soluble reaction products of vinyl alcohol polymers with ethylene oxide, or products obtained by grafting vinyl alcohol (derivatives) onto polyethylene oxide, where the amount of ethylene oxide units in the oxyethylated vinyl alcohol polymer is from 5 to 75, in particular from 10 to 60, % by weight. These reaction products of vinyl alcohol polymers can be present in the mixtures either as the sole polymer component or as a mixture with other vinyl alcohol polymers, in particular the stated hydrolyzed polyvinyl esters, in which case the amount of the reaction products of the polyvinyl alcohol is advantageously not less than 30% by weight, based on the total amount of vinyl alcohol polymers present in the mixture. Moreover, the stated vinyl alcohol polymers or copolymers and/or their derivatives can be mixed with not more than about 30% by weight, based on the amount of polymer in the particular photopolymerizable material, of compatible melamine/formaldehyde, urea/formaldehyde or phenol/formaldehyde resins.

The conventional cellulose derivatives, gelatin, alginates and polyvinylpyrrolidone, when used as the base polymer, also meet the requirements set.

Suitable photopolymerizable ethylenically unsaturated monomers for the mixture include the conventional monomers which have a molecular weight of less than 2,000 and are known per se in connection with photopolymerizable materials containing polymeric binders. Of course, the type and amount of the photopolymerizable monomers depend on the polymeric binder used concomitantly, and the stated monomers should be compatible with this binder. Low molecular weight photopolymerizable compounds possessing two or more ethylenically unsaturated photopolymerizable double bonds are very useful either alone or as a mixture with monomers containing only one olefinically unsaturated photopolymerizable double bond. The amount of monomers containing only one double bond depends on the polymer binders present. With certain preconditions, it is of course possible for the photopolymerizable monomers used to be predominantly those which contain only one photopolymerizable double bond in the molecule, particularly when the polymer binder present itself contains a high proportion of photocrosslinkable double bonds, this being the case, for example, when the vinyl alcohol polymers possessing acryloyl and/or methacryloyl groups are used. In general, the photopolymerizable monomers have a boiling point above 100° C. under atmospheric pressure.

Examples of low molecular weight photopolymerizable unsaturated compounds are mono-, di- and polyacrylates and -methacrylates, as can be prepared by esterification of acrylic acid or methacrylic acid with low molecular weight monohydric or polyhydric alcohols. Such compounds include the di- and tri(meth)acrylates of ethylene glycol, diethylene glycol, triethylene glycol, polyethylene glycol having a molecular weight as high as 500, propane-1,2-diol, propane-1,3-diol, polypropylene glycols having a molecular weight as high as about 500, neopentylglycol (2,2-dimethylpropanediol), butane-1,4-diol, 1,1,1trimethylolpropane, glycerol and pentaerythritol, as well as the monoacrylates and monomethacrylates of such diols or polyols, eg. ethylene glycol monoacrylate and monomethacrylate, propane-1,2-diol monoacrylate and monomethacrylate, propane-1,3-diol monoacrylate and monomethacrylate, and di-, tri- and tetraethylene glycol monoacrylate and monomethacrylate. Other suitable compounds are those which contain urethane and/or amide groups, such as the low molecular weight compounds prepared from aliphatic diols of the above type, organic diisocyanates, eg. hexamethylene diisocyanate, toluylene diisocyanate and isophorone diisocyanate, and hydroxyalkyl acrylates or methacrylates of the above type. Other examples are acrylic acid, methacrylic acid, acrylates and methacrylates of alkanols of 1 to 6 carbon atoms, mono- and bisacrylamides and -methacrylamides of aliphatic or aromatic diamines of 2 to 8 carbon atoms, for example those of ethylenediamine, propylenediamine, butylenediamine, pentamethylenediamine, hexamethylenediamine, octamethylenediamine or xylylenediamine, as well as derivatives of acrylamide or methacrylamide, eg. hydroxymethylacrylamide or -methacrylamide, and in particular the reaction products of 2 moles of N-hydroxymethyl acrylamide or methacrylamide with one mole of an aliphatic diol, eg. ethylene glycol or propylene glycol.

The range of suitable monomers depends on the polymer binders present and on the desired properties of the end product, and is familiar to the skilled worker. If vinyl alcohol polymers are used as polymer binders, particularly suitable monomers are the water-soluble monomers, eg. the hydroxyalkyl acrylates or methacrylates, the mono- or diacrylates or mono- or dimethacrylates of polyethylene glycols or mixtures of these with di- or polyacrylates or di- or polymethacrylates of the stated type.

The photopolymerizable mixtures contain in general about 50–90% by weight of the polymers and from 10 to 50% by weight of the photopolymerizable ethylenically unsaturated monomers, the percentages being based on the sum of polymers and monomers in each case. In particular cases, the amount of monomers can be larger or smaller. For example, it is possible to reduce the amount of monomers to below 10% by weight when the mixture contains unsaturated polymers having a sufficiently high content of photocrosslinkable double bonds.

The photopolymerization initiators are present in the mixtures in general in amounts of from 0.05 to 10, in particular from 0.5 to 5, % by weight, based on the mixture, and suitable initiators are the conventional photopolymerization initiators and systems for initiating photopolymerization during exposure to actinic light, as adequately described in the relevant specialist literature. Examples of suitable initiators are acyloins and their derivatives, such as benzoin, benzoin alkyl ethers, eg. benzoin methyl ether or benzoin isopropyl ether, α-methylolbenzoin and its ethers or α-methylbenzoin and its ethers; 1,2-diketones and their derivatives, such as diacetyl, benzil, benzil ketals, eg. benzil dimethyl ketal, benzil methyl ethyl ketal, benzil methyl benzyl ketal or benzil ethylene glycol monoketal; acylphosphine oxide compounds, in particular acyldiarylphosphine oxides and especially acyldiphenylphosphine oxides whose acyl radical is derived from a tertiary aliphatic or cycloaliphatic carboxylic acid or from a benzoic acid which is substituted at least in the 2,6-position, as described in detail in German Laid-Open Application DOS No. 2,909,992. The photopolymerization initiators can be used alone or as a mixture with one another or with activators, eg. tertiary amines.

The photopolymerizable mixtures can also contain, as further additives, for example, plasticizers, dyes, pigments or the like.

The photosensitive recording materials are exposed to light sources which are capable of emitting actinic light in the wavelength range of in general from 250 to 500 nm, preferably from 300 to 450 nm, and whose emission maxima are in general in the region of the absorption of the photoinitiators.

The elements obtainable using the highly sensitive photopolymerizable mixtures can, depending on the composition, be used for a large variety of purposes, especially for information processing. For example, it is possible for directly readable or digital information to be written, reproduced and, if desired, transferred to other information systems. Suitable practical applications include the production of images and resists for electrically conductive systems and related uses, the production of surface images and reliefs, layers for black-and-white and color films, and printing plates for letterpress printing, offset printing, gravure printing and screen printing, and for making duplicate printing plates, producing images for color-testing methods, and other reprographic purposes, materials for archiving image and text information, and for the production of lists and index.

The thickness of the photosensitive layer can be varied within wide limits, depending on the intended use. It is of course also possible to produce multilayer systems. In most cases, the photopolymerizable mixture is applied onto a base which is suitable for the intended use, eg. metal, plastic or paper. Ceramic materials and semiconductor materials are also suitable.

The novel process permits the preparation of photopolymerizable mixtures which possess increased sensitivity and high resolution in information processing, coupled with substantially improved stability to thermal polymerization at both room temperature and temperatures as high as 100° C. The time during which the mixture is stable to spontaneous thermal polymerization or other types of spontaneous polymerization is prolonged in many cases by a factor of from 2–10. The handling of some highly sensitive mixtures in industry has only become possible at all as a result of the stabilization according to the invention.

The Examples and Comparative Examples which follow illustrate the invention, parts are by weight, unless stated otherwise.

EXAMPLE 1

67.5 parts of a polyvinylpyrrolidone having a molecular weight of from 600,000 to 800,000 (K value 92) are dissolved in 400 parts of fully demineralized water at 90° C., after which 0.05 part of the adduct of potassium iodide and iodine (molar ratio about 1:1) is stirred in. After 3 hours at 70° C., 30 parts of diether obtained from 1 mole of ethylene glycol and 2 moles of N-hydroxymethylacrylamide, 0.1 part of N-nitrosocyclohexylhydroxylamine and 2.5 parts of α-methylolbenzoin methyl ether are added. As soon as all of the components have dissolved, the solution is filtered, devolatilized under reduced pressure and then used to produce photosensitive elements.

A sample subjected to a stability test in a closed ampoule at 80° C. in the absence of actinic radiation remains unchanged for 70 hours, whereas a mixture which has not been treated in accordance with the invention solidifies after only 6 hours. The stability factor is thus $>11$.

EXAMPLE 2

The procedure described in Example 1 is followed, except that the polyvinylpyrrolidone solution is treated with 0.25% of a commercial complex of polyvinylpyrrolidone and iodine (containing 11–12% of iodine) for 8 hours at 80° C.

The stability test (80° C.) gives a result similar to that of Example 1, i.e. a stability factor $>11$.

EXAMPLE 3

The procedure described in Example 1 is followed, except that the polyvinylpyrrolidone solution described in Example 1 is treated with 0.03 part of iodine for 3 hours at 60° C.

The stability of the resulting photopolymerizable mixture is increased by a factor of 4.

EXAMPLE 4

68 parts of an N-vinylpyrrolidone/vinyl acetate copolymer (weight ratio 60:40) having a K value of 32 are dissolved in 67 parts of fully demineralized water at 70°

C., after which the solution is treated with 0.25 part of a complex of polyvinylpyrrolidone and iodine (containing 11–12% of iodine) for 3 hours at the same temperature. 25 parts of 2-hydroxyethyl methacrylate, 5 parts of trimethylol propane triacrylate, 2.0 parts of benzil dimethyl ketal and 0.02 part of N-nitrosodiphenylamine are then stirred in. The solution is filtered, devolatilized under reduced pressure and then used for producing photosensitive layers.

In the stability test at 80° C. in a closed ampoule, fine popcorn-like polymer particles begin to separate out after 55 hours from the otherwise unchanged solution. The polymer particles increase only slowly. In contrast, in an untreated comparative mixture, substantial, more rapidly increasing polymer formation is observed after only 18 hours. The stability factor is thus 3.

EXAMPLE 5

The solution of the copolymer is treated with 0.005 part of an adduct of potassium iodide and iodine (molar ratio about 1:1), using a modified form of the above Example. The treatment time is 4 hours at 70° C., after which the mixture is processed further as described in Example 4.

The stability of the resulting photopolymerizable mixture is increased by a factor of 1.7.

EXAMPLE 6

The procedure described in Example 5 is followed, except that the amount of potassium iodide-iodine adduct used for the treatment of the copolymer solution is increased to 0.05 part. The stability factor increases to 2.3.

EXAMPLE 7

The amounts used in Example 6 are retained, but the treatment of the copolymer solution with the potassium iodide-iodine adduct is carried out for 24 hours at 40° C. The stability factor is then 2.7.

EXAMPLE 8

328 parts of a partially hydrolyzed polyvinyl acetate having a degree of hydrolysis of 82 mol % and a mean degree of polymerization of 500 are dissolved in 294 parts of fully demineralized water at 90° C., 2.5 parts of a complex of polyvinylpyrrolidone and iodine (containing 11–12% of iodine) are added, and the solution is then stirred for 4 hours at 70° C. 51 parts of butane-1,4-diol dimethacrylate, 9.6 parts of benzil dimethyl ketal and 1.0 part of 2,6-di-tert.-butyl-p-cresol, dissolved in 241 parts of β-hydroxyethyl methacrylate, are then added, likewise while stirring. The homogeneous solution is filtered and then devolatilized under reduced pressure. Photosensitive laminates are obtained by coating suitable bases.

When the solution is subjected to a stability test in a closed ampoule at 80° C., the first polymer particles are observed only after 70 hours, whereas an untreated comparative mixture polymerizes after only 32 hours. The stability factor is therefore 2.2.

EXAMPLE 9

39.5 parts of a partially hydrolyzed polyvinyl acetate having a degree of hydrolysis of 80 mol % and a mean degree of polymerization of 500 are dissolved in 40 parts of fully demineralized water at 90° C. The solution is cooled to 70° C., after which 9.9 parts of a partially hydrolyzed polyvinyl acetate which contains 22% of bonded $CH_2$—$CH_2$—O units and has a mean molecular weight of from 25,000 to 30,000 are added, while stirring. The resulting homogeneous solution is then treated with 0.05 part of an adduct of potassium iodide and iodine (molar ratio about 1:1) for 3 hours at 70° C. A solution of 7.6 parts of butane-1,4-diol dimethacrylate, 0.5 part of 2,4,6-trimethylbenzoyldiphenylphosphine oxide, 0.15 part of 2,6-di-tert.-butyl-p-cresol and 0.02 part of N-nitrosodiphenylamine in 42 parts of β-hydroxyethyl methacrylate is then stirred in, after which the solution is filtered, devolatilized, and processed to give photosensitive elements. The stability factor determined by the method used in Example 8 is 1.9.

EXAMPLE 10

Example 9 is varied by using 0.25 part (instead of 0.05 part) of the adduct of potassium iodide and iodine. All other components of the recipe remain unchanged. The stability test then gives a factor of 2.7.

EXAMPLE 11

18 parts of a partially hydrolyzed polyvinyl acetate having a degree of hydrolysis of 80 mol % and a mean molecular weight of from 30,000 to 35,000, and 18 parts of a partially hydrolyzed polyvinyl acetate having a degree of hydrolysis of 88 mol % and a mean molecular weight of 30,000, are dissolved in 40 parts of fully demineralized water at 90° C. by stirring for several hours. The solution is cooled to 70° C., after which 18 parts of a partially hydrolyzed polyvinyl acetate which contains 22% of bonded $CH_2$—$CH_2$—O units and has a mean molecular weight of from 25,000 to 30,000 are added, while stirring. The resulting homogeneous polymer solution is then treated with 0.3 part of an adduct of potassium iodide and iodine for 3 hours at 80° C., likewise while stirring. A solution of 3 parts of tetraethylene glycol dimethacrylate, 1.7 parts of benzil dimethyl ketal, 0.15 part of 2,6-di-tert.-butyl-p-cresol, 0.03 part of N-nitrosocyclohexylhydroxylamine and 0.003 part of eosin in 40 parts of β-hydroxyethyl methacrylate is then added, and the mixture is homogenized, filtered, and devolatilized under reduced pressure. The resulting photopolymerizable solution is used for producing photosensitive elements. The stability test at 80° C. gives a factor of 2.3.

We claim:

1. In a process for stabilizing a photopolymerizable mixture consisting essentially of a polymer selected from the group consisting of vinyl alcohol polymers containing —$CH_2CH(OH)$ structural units in the main chain, their water-soluble or water-dispersible copolymers and derivatives, cellulose derivatives, gelatin and vinyl pyrrolidone polymers, at least one polymerizable ethylenically unsaturated compound and at least one compound selected from the group consisting of photoinitiators and photosensitizers to thermal polymerization, the improvement which comprises: pretreating the polymer, prior to preparing said mixture, with a compound selected from the group consisting of halogens, psuedohalogens and polyhalides in the presence of water at from 20° to 100° C. in the course of from half an hour to several days.

2. The improved process of claim 1, wherein the pretreated polymer is a hydrolyzed polyvinyl acetate having a mean degree of polymerization of from 200 to 3,000 and a degree of hydrolysis of from 65 to 100.

3. The improved process of claim 1, wherein the pretreated polymer is a hydrolyzed polyvinyl acetate having a mean degree of polymerization of from 250 to 750 and a degree of hydrolysis of from 80 to 88.

4. The process of claim 1, wherein the polymer is pretreated for a period of from 3 to 24 hours.

* * * * *